United States Patent
Kamiya et al.

(10) Patent No.: US 11,309,813 B2
(45) Date of Patent: Apr. 19, 2022

(54) OPENING/CLOSING BODY DRIVE DEVICE AND CONTROL METHOD THEREOF

(71) Applicant: AISIN CORPORATION, Aichi (JP)

(72) Inventors: Noriyuki Kamiya, Kariya (JP); Taishi IIkawa, Kariya (JP)

(73) Assignee: AISIN CORPORATION, Kariya (JP)

( * ) Notice: Subject to any disclaimer, the term of this patent is extended or adjusted under 35 U.S.C. 154(b) by 0 days.

(21) Appl. No.: 17/029,397

(22) Filed: Sep. 23, 2020

(65) Prior Publication Data
US 2021/0099114 A1    Apr. 1, 2021

(30) Foreign Application Priority Data
Sep. 27, 2019 (JP) .............................. JP2019-176980

(51) Int. Cl.
*H02P 3/04* (2006.01)
*H02P 23/24* (2016.01)
(Continued)

(52) U.S. Cl.
CPC .............. *H02P 7/04* (2016.02); *E05F 15/611* (2015.01); *G01R 19/16538* (2013.01);
(Continued)

(58) Field of Classification Search
CPC .... H02P 7/04; H02P 3/14; H02P 23/24; H02P 7/05; H02P 7/285; H03K 17/08; H03K 17/08122; E05F 15/611; G01R 19/16538
See application file for complete search history.

(56) References Cited

U.S. PATENT DOCUMENTS

| | | | | |
|---|---|---|---|---|
| 4,581,565 A | * | 4/1986 | Van Pelt | H02P 7/04 318/294 |
| 4,710,686 A | * | 12/1987 | Guzik | H02M 7/53871 318/293 |

(Continued)

FOREIGN PATENT DOCUMENTS

| | | |
|---|---|---|
| JP | 6-127418 A | 5/1994 |
| JP | 11-18464 A | 1/1999 |

(Continued)

OTHER PUBLICATIONS

U.S. Appl. No. 17/029,387, filed Sep. 23, 2020, Aisin Seiki Kabushiki Kaisha.

*Primary Examiner* — Thai T Dinh
(74) *Attorney, Agent, or Firm* — Oblon, McClelland, Maier & Neustadt, L.L.P.

(57) ABSTRACT

An opening/closing body drive device includes: a motor which opens or closes an opening/closing body; a drive unit which rotates the motor; and a control unit which controls the drive unit. The drive unit includes first and second integrated circuits having first and second switching elements and third and fourth switching elements which are connected to each other in series with respect to a power source and connection points of which are connected to one and the other terminals of the motor, respectively. The control unit turn-on drives only the second switching element when braking the motor during the forward rotation and turn-on drives only the fourth switching element when braking the motor during the reverse rotation, or turn-on drives only the third switching element when braking the motor during the forward rotation and turn-on drives only the first switching element when braking the motor during the reverse rotation.

2 Claims, 4 Drawing Sheets

(51) Int. Cl.
*E05F 15/611* (2015.01)
*H02P 7/03* (2016.01)
*H02P 7/285* (2016.01)
*H02P 3/14* (2006.01)
*H03K 17/0812* (2006.01)
*G01R 19/165* (2006.01)

(52) U.S. Cl.
CPC ............... *H02P 3/14* (2013.01); *H02P 7/285* (2013.01); *H03K 17/08122* (2013.01); *E05Y 2201/434* (2013.01); *E05Y 2400/36* (2013.01); *E05Y 2900/531* (2013.01); *E05Y 2900/548* (2013.01)

(56) References Cited

U.S. PATENT DOCUMENTS

| | | | | |
|---|---|---|---|---|
| 4,879,641 | A * | 11/1989 | Rossi | H02P 7/04 363/98 |
| 4,988,931 | A * | 1/1991 | Tsukahara | H02H 7/0838 318/280 |
| 5,287,046 | A * | 2/1994 | Carpenter | G11B 21/02 318/293 |
| 7,741,794 | B2 * | 6/2010 | Nishibe | B60R 1/074 318/256 |
| 10,003,332 | B2 * | 6/2018 | Kimura | H03K 5/1565 |
| 11,038,341 | B2 * | 6/2021 | Nakashima | H02H 7/1227 |
| 2008/0315804 | A1 * | 12/2008 | Nishibe | H03K 17/0822 318/256 |
| 2016/0285394 | A1 * | 9/2016 | Kubota | H02P 3/14 |
| 2017/0085208 | A1 | 3/2017 | Yamamoto et al. | |
| 2020/0300021 | A1 * | 9/2020 | Nagler | E05F 15/611 |

FOREIGN PATENT DOCUMENTS

| | | |
|---|---|---|
| JP | 2017-57645 | 3/2017 |
| JP | 2018-201646 | 12/2018 |

\* cited by examiner

OPENING/CLOSING BODY DRIVE DEVICE AND CONTROL METHOD THEREOF

CROSS REFERENCE TO RELATED APPLICATIONS

This application is based on and claims priority under 35 U.S.C. § 119 to Japanese Patent Application 2019-176980, filed on Sep. 27, 2019, the entire content of which is incorporated herein by reference.

TECHNICAL FIELD

This disclosure relates to an opening/closing body drive device and a control method thereof.

BACKGROUND DISCUSSION

In the related art, an opening/closing body drive device is known, which includes a motor for opening or closing a toilet seat, a drive unit for supplying electric power from a power source to the motor to rotate the motor forward or reversely, and a microcomputer for controlling the drive unit (for example, refer to JP 2018-201646A). Here, the drive unit includes an H bridge circuit having first to fourth switching elements. A set of the first and second switching elements connected in series and a set of the third and fourth switching elements connected in series are connected in parallel to each other, and a connection point of the first and second switching elements and a connection point of the third and fourth switching elements are connected to both terminals of the motor. Moreover, a voltage from the power source is applied to a connection point of the first and third switching elements, and a connection point of the second and fourth switching elements is grounded. In this opening/closing body drive device, the motor can be driven to be rotated forward by turning on (applying power to) the first and fourth switching elements. Further, the motor can be driven to be rotated reversely by turning on the second and third switching elements. Further, it is possible to short-circuit both terminals of the motor and apply a brake (short brake) to a rotation of the motor by turn-on driving the second and fourth switching elements.

A first integrated circuit having first and second switching elements and a second integrated circuit having third and fourth switching elements may be used as a drive unit. In this case, when the motor is braked by turn-on driving the second and fourth switching elements during a forward rotation or a reverse rotation of the motor, thermal loads of the first and second integrated circuits caused by switching losses of the second and fourth switching elements may reduce life of the first and second integrated circuits.

A need thus exists for an opening/closing body drive device and a control method thereof which are not susceptible to the drawback mentioned above.

SUMMARY

An opening/closing body drive device and the control method thereof according to this disclosure adopts the following means.

An opening/closing body drive device according to an aspect of this disclosure includes: a motor which opens or closes an opening/closing body; a drive unit which rotates the motor; and a control unit which controls the drive unit, in which the drive unit includes a first integrated circuit having first and second switching elements which are connected to each other in series with respect to a positive electrode side and a negative electrode side of a power source and a connection point of which is connected to one terminal of the motor, and a second integrated circuit having third and fourth switching elements which are connected to each other in series with respect to the positive electrode side and the negative electrode side and a connection point of which is connected to the other terminal of the motor, first to fourth freewheeling diodes are incorporated in or attached in parallel to the first to fourth switching elements, the control unit turn-on drives the first and fourth switching elements when driving the motor to be rotated forward and turn-on drives the second and third switching elements when driving the motor to be rotated reversely, and the control unit turn-on drives only the second switching element of the first to fourth switching elements when braking the motor during the forward rotation of the motor and turn-on drives only the fourth switching element of the first to fourth switching elements when braking the motor during the reverse rotation of the motor, or the control unit turn-on drives only the third switching element of the first to fourth switching elements when braking the motor during the forward rotation of the motor and turn-on drives only the first switching element of the first to fourth switching elements when braking the motor during the reverse rotation of the motor.

A control method of opening/closing body drive device according to another aspect of this disclosure is a control method of opening/closing body drive device including: a motor which opens or closes an opening/closing body, and a drive unit which rotates the motor, in which the drive unit includes a first integrated circuit having first and second switching elements which are connected to each other in series with respect to a positive electrode side and a negative electrode side of a power source and a connection point of which is connected to one terminal of the motor, and a second integrated circuit having third and fourth switching elements which are connected to each other in series with respect to the positive electrode side and the negative electrode side and a connection point of which is connected to the other terminal of the motor, and first to fourth freewheeling diodes are incorporated in or attached in parallel to the first to fourth switching elements. The method includes: turn-on driving the first and fourth switching elements when driving the motor to be rotated forward and turn-on driving the second and third switching elements when driving the motor to be rotated reversely; and turn-on driving only the second switching element of the first to fourth switching elements when braking the motor during the forward rotation of the motor and turn-on driving only the fourth switching element of the first to fourth switching elements when braking the motor during the reverse rotation of the motor, or turn-on driving only the third switching element of the first to fourth switching elements when braking the motor during the forward rotation of the motor and turn-on driving only the first switching element of the first to fourth switching elements when braking the motor during the reverse rotation of the motor.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Next, embodiments of this disclosure will be described with reference to the drawings.

Figure 1:
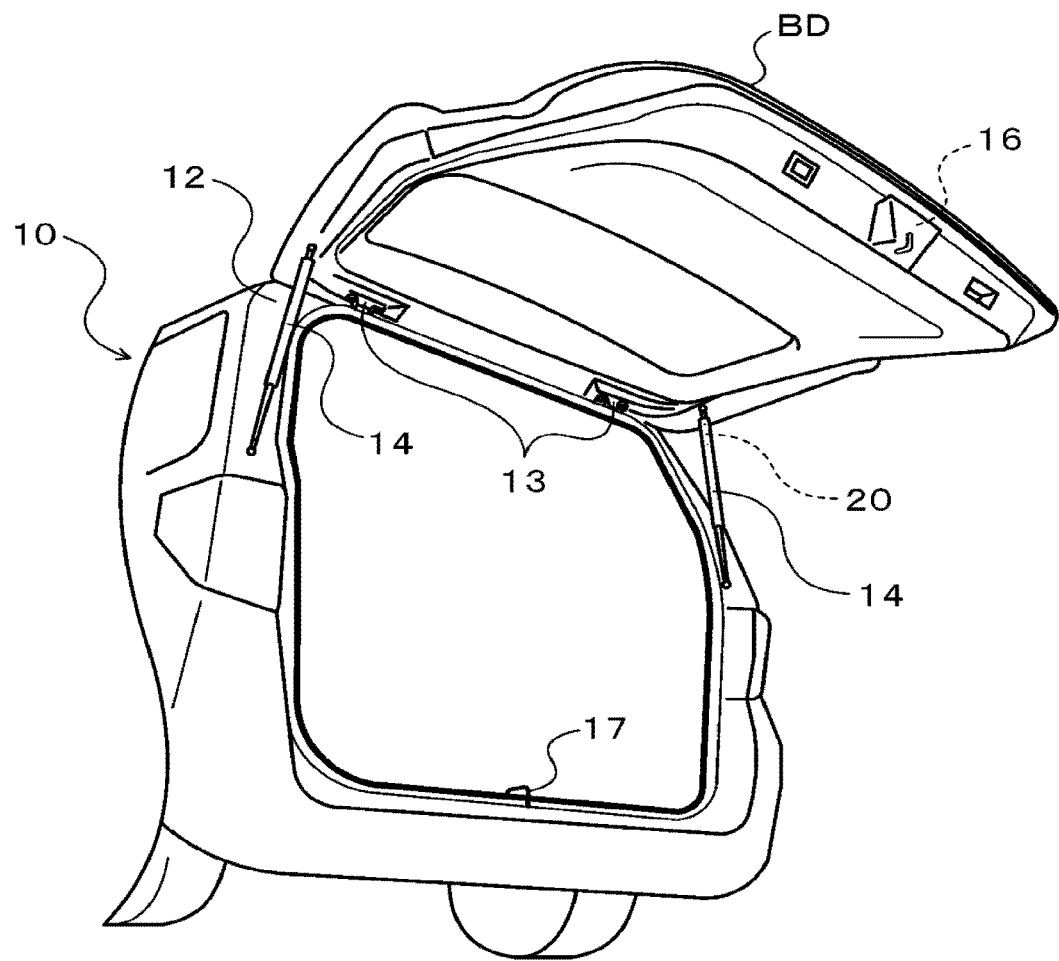
FIG. 1 is an external view of a vehicle including a back door drive device as an opening/closing body drive device of the present embodiment.
Figure 2:
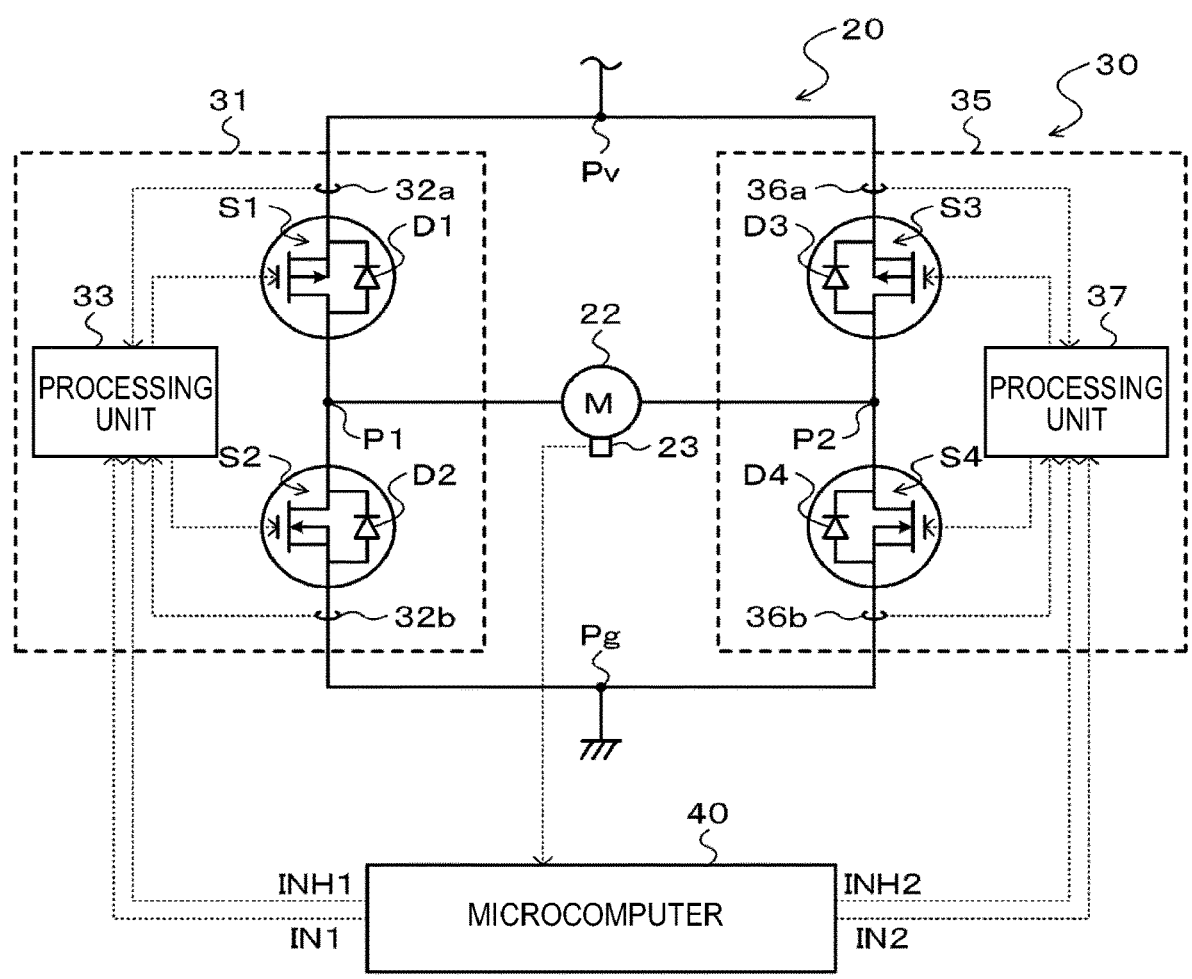
FIG. 2 is a configuration diagram illustrating an outline of a configuration of the back door drive device.

FIG. 1 is an external view of a vehicle 10 including a back door drive device 20 as an opening/closing body drive device of the present embodiment. FIG. 2 is a configuration diagram illustrating an outline of a configuration of the back door drive device 20. As illustrated in the drawings, the vehicle 10 of the present embodiment includes a flip-up type back door BD which is supported by a vehicle body 12 via hinges 13 so as to be openable and closable, extendable support members 14, a door closer 16, and the back door drive device 20 for opening and closing the back door BD. The door closer 16 is incorporated in a lower inner portion of the back door BD so as to be engageable with the striker 17 fixed to a lower portion of an opening portion of the vehicle body 12 opened and closed by the back door BD.

The back door drive device 20 is configured as a device which opens or closes the back door BD by converting a rotation of the motor 22 into a linear motion and expanding and contracting the support member 14. The back door drive device 20 includes a motor 22 which opens or closes the back door BD, a drive unit 30 which rotates the motor 22, and a microcomputer (control unit) 40 which controls the drive unit 30. In the embodiment, rotation directions of the motor 22 for closing and opening the back door BD are referred to as a forward direction and a reverse direction of the motor 22, respectively.

The drive unit 30 includes integrated circuits 31 and 35. The integrated circuit 31 is configured as a half bridge IC having switching elements S1 and S2 connected to each other in series, and the integrated circuit 35 is configured as a half bridge IC having switching elements S3 and S4 connected to each other in series. As the switching elements S1 and S3, p-channel field effect transistors (FETs) in which parasitic diodes (body diodes) D1 and D3 functioning as freewheeling diodes are incorporated are used, respectively. Further, as the switching elements S2 and S4, n-channel field effect transistors (FETs) in which parasitic diodes D2 and D4 functioning as freewheeling diodes are incorporated are used, respectively.

A set of the switching elements S1 and S2 and a set of the switching elements S3 and S4 are connected to each other in parallel. One terminal of the motor 22 is connected to a connection point P1 of the switching elements S1 and S2, and the other terminal of the motor 22 is connected to a connection point P2 of the switching elements S3 and S4. A connection point Pv of the switching elements S1 and S3 is connected to a positive electrode side of a power source via a power line, and a connection point Pg of the switching elements S2 and S4 is grounded (connected to a negative electrode side of the power source via a power line such as a metal case). In this way, the switching elements S1 to S4 form an H bridge circuit.

The integrated circuit 31 includes, in addition to the switching elements S1 and S2, overcurrent detection units 32a and 32b for detecting overcurrent of the switching elements S1 and S2, a processing unit 33, and a communication port (port for INH1 signal or port for IN1 signal). The processing unit 33 turn-on drives the switching elements S1 and S2 based on the INH1 signal or the IN1 signal from the microcomputer 40. Specifically, the processing unit 33 turns off (does not turn-on drive) both the switching elements S1 and S2 when the INH1 signal is off, the processing unit 33 turn-on drives the switching element S1 when both the INH1 signal and the IN1 signal are on, and the processing unit 33 turn-on drives the switching element S2 when the INH1 signal is on and the IN1 signal is off. Here, the "turn-on drive" includes drive which is held to be turned on and drive which is turned on or off by a pulse width modulation (PWM) control. The processing unit 33 has a first protection function of, when an overcurrent of the switching element S1 is detected during turn-on driving of the switching element S1, switching the turning-on driving of the switching element S1 to the turn-on driving of the switching element S2 regardless of the IN1 signal, and when an overcurrent of the switching element S2 is detected during turn-on driving of the switching element S2, switching the turning-on driving of the switching element S2 to the turn-on driving of the switching element S1 regardless of the IN1 signal.

The integrated circuit 35 includes, in addition to the switching elements S3 and S4, overcurrent detection units 36a and 36b for detecting overcurrent of the switching elements S3 and S4, a processing unit 37, and a communication port (port for INH2 signal or port for IN2 signal). The processing unit 37 turn-on drives the switching elements S3 and S4 based on the INH2 signal or the IN2 signal from the microcomputer 40. Specifically, the processing unit 37 turns off both the switching elements S3 and S4 when the INH2 signal is off, the processing unit 37 turn-on drives the switching element S3 when both the INH2 signal and the IN2 signal are on, and the processing unit 37 turn-on drives the switching element S4 when the INH2 signal is on and the IN2 signal is off. The processing unit 37 has a second protection function of, when an overcurrent of the switching element S3 is detected during turn-on driving of the switching element S3, switching the turning-on driving of the switching element S3 to the turn-on driving of the switching element S4 regardless of the IN2 signal, and when an overcurrent of the switching element S4 is detected during turn-on driving of the switching element S4, switching the turning-on driving of the switching element S4 to the turn-on driving of the switching element S3 regardless of the IN2 signal.

The microcomputer 40 is configured as a microcomputer having a CPU, ROM, RAM, and an input/output port. A rotation speed Nm of the motor 22 from a rotation speed sensor 23 which detects the rotation speed of the motor 22 is input to the microcomputer 40 via an input port. The microcomputer 40 outputs the INH1 signal and the IN1 signal to the integrated circuit 31 and the INH2 signal and the IN2 signal to the integrated circuit 35 through the output port.

In the back door drive device 20 of the embodiment configured as described above, when the motor 22 is driven to be rotated forward in response to a switch operation (switch is not illustrated) or the like for closing the back door BD by the user and the back door BD is closed, the microcomputer 40 controls the INH1 signal, the IN1 signal, the INH2 signal, and the IN2 signal so that the switching elements S1 and S4 are turn-on driven. Further, when the motor 22 is driven to be rotated reversely in response to a switch operation or the like for opening the back door BD by the user and the back door BD is opened, the microcomputer 40 controls the INH1 signal, the IN1 signal, the INH2 signal, and the IN2 signal so that the switching elements S2 and S3 are turn-on driven. The motor 22 rotates forward or reversely even when the back door BD moves in a closing direction or an opening direction by an operation of the back door BD in the closing direction or the opening direction by the user or weight of the back door BD.

Figure 3:
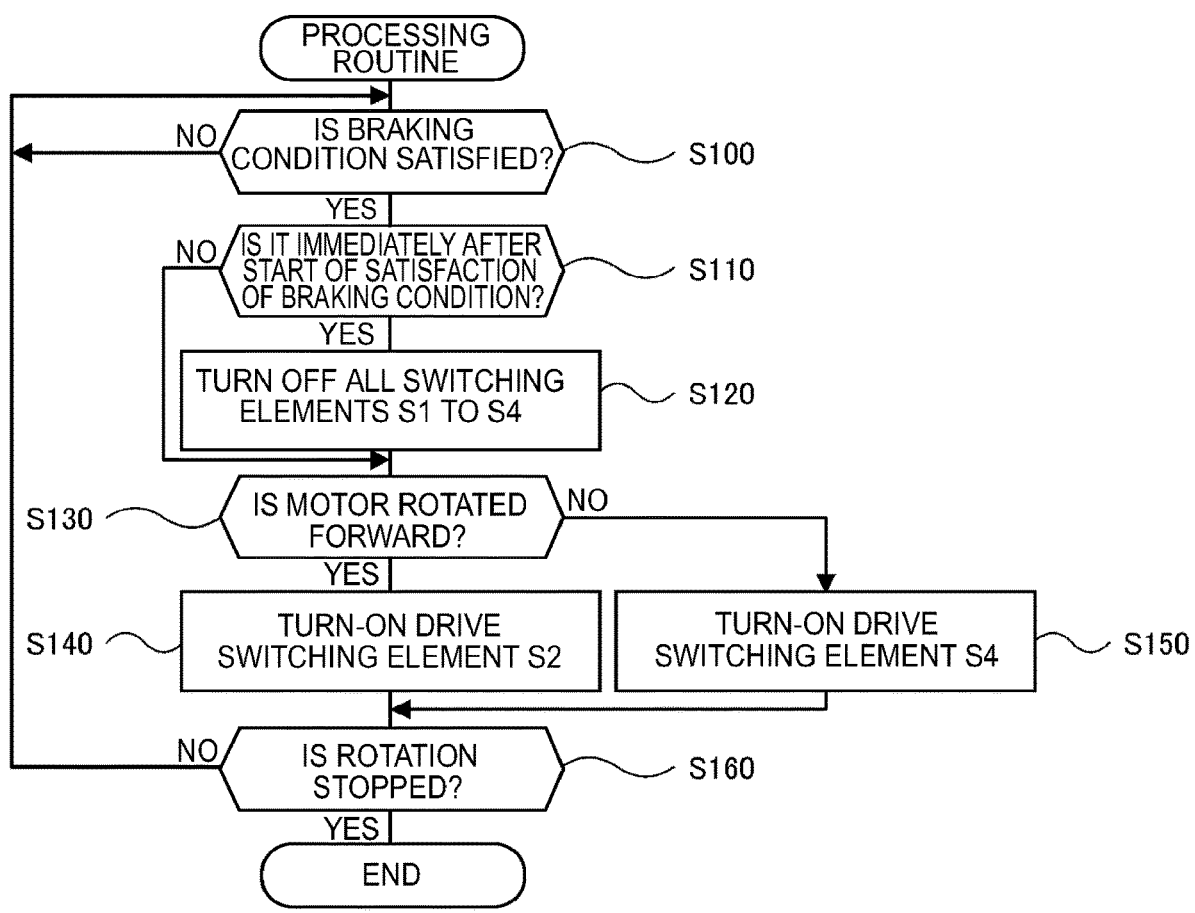
FIG. 3 is a flowchart illustrating an example of a processing routine executed by a microcomputer.

Next, an operation of the back door drive device 20 of the embodiment configured as described above, particularly an operation when braking the motor 22 will be described. FIG. 3 is a flowchart illustrating an example of a processing routine executed by the microcomputer 40. This routine is executed when the motor 22 starts rotating (forward rotation or reverse rotation).

When the processing routine of FIG. 3 is executed, first, the microcomputer 40 determines whether or not a braking condition is satisfied (Step S100), and when the microcomputer 40 determines that the braking condition is not satisfied, the microcomputer 40 waits for the braking conditions to be satisfied. Here, as the braking condition, a condition in which an absolute value of the rotation speed Nm of the motor 22 is a threshold value Nmref or more, a condition in which a position of the back door BD is located between a predetermined position slightly before (on a slightly open side or a slightly closed side of) a target stop position (fully closed position or fully open position) and a target stop position, or the like is used. The threshold value Nmref is used to determine whether or not the absolute value of the rotation speed Nm of the motor 22 is relatively large. The position of the back door BD is estimated based on a length (an amount of expansion and contraction) of the support member 14 detected by a sensor (not illustrated). The predetermined position is determined so that the back door BD can be stopped at the target stop position by braking the motor 22. In the embodiment, it is determined that the braking condition is satisfied when at least one of these conditions is satisfied.

When it is determined in Step S100 that the braking condition is satisfied, it is determined whether or not it is immediately after start of the satisfaction of the braking condition (Step S110). When it is determined that it is immediately after the start of the satisfaction of the braking condition, the INH1 signal, IN1 signal, INH2 signal, and IN2 signal are controlled so that all of the switching elements S1 to S4 are turned off (Step S120). As a result, when the motor 22 is driven to be rotated forward or reversely, the driving is stopped. When it is determined in Step S110 that it is not immediately after the start of the satisfaction of the braking condition (satisfaction of the braking condition is continuously performed), the processing of Step S120 is not executed.

Subsequently, the rotation direction (movement direction of the back door BD) of the motor 22 is determined based on the rotation speed Nm of the motor 22 (Step S130). When the user performs a switch operation for opening or closing the back door BD, the rotation direction of the motor 22 may be determined based on the switch operation.

When it is determined in Step S130 that the motor 22 rotates forward (the back door BD is closed), the INH1 signal, the IN1 signal, the INH2 signal, and the IN2 signal are controlled so that only the switching element S2 among the switching elements S1 to S4 is turn-on driven (Step S140). When the motor 22 is rotated forward, if only the switching element S2 among the switching elements S1 to S4 is turn-on driven, a closed circuit of the switching element S2, the parasitic diode D4, the motor 22, and the switching element S2 is formed, and thus, it is possible to brake the motor 22.

When it is determined in Step S130 that the motor 22 rotates reversely (the back door BD is opened), the INH1 signal, the IN1 signal, the INH2 signal, and the IN2 signal are controlled so that only the switching element S4 among the switching elements S1 to S4 is turn-on driven (Step S150). When the motor 22 is rotated reversely, if only the switching element S4 among the switching elements S1 to S4 is turn-on driven, a closed circuit of the switching element S4, the parasitic diode D2, the motor 22, and the switching element S4 is formed, and thus, it is possible to brake the motor 22.

Then, it is determined whether or not the rotation of the motor 22 is stopped (Step S160), and when it is determined that the motor 22 rotates, the processing returns to Step S100. In this way, the processing of Steps S100 to S160 is repeatedly executed, and when it is determined in Step S160 that the rotation of the motor 22 is stopped, this routine ends.

Here, as a comparative mode, a mode in which the motor 22 is braked by turn-on driving the switching elements S2 and S4 of the integrated circuits 31 and 35 regardless of the rotation direction of the motor 22 is considered. In this comparative mode, thermal loads of the integrated circuits 31 and 35 caused by switching losses of the switching elements S2, and S4 or the like may reduce life of the integrated circuits 31 and 35. Meanwhile, in the present embodiment, the switching element S2 of the integrated circuit 31 is turn-on driven when braking the motor 22 during the forward rotation of the motor 22, and the switching element S4 of the integrated circuit 35 is turn-on driven when braking the motor 22 during the reverse rotation of the motor 22. That is, the switching elements of different integrated circuits are turn-on driven when braking the motor 22 during the forward rotation of the motor 22 and when braking the motor 22 during the reverse rotation of the motor 22. Accordingly, it is possible to reduce accumulation of thermal loads acting on the integrated circuits 31 and 35. As a result, it is possible to suppress a decrease in the life of the integrated circuits 31 and 35.

Further, in the comparative mode, the following inconvenience may occur. When an overcurrent flows to the switching element S2 and the first protection function of the integrated circuit 31 is operated, the motor 22 is driven to be rotated forward by the turn-on driving of the switching elements S1 and S4. When an overcurrent flows to the switching element S4 and the second protection function of the integrated circuit 35 is operated, the motor 22 is driven to be rotated reversely by the turn-on driving of the switching elements S2 and S3. Meanwhile, only the switching element S2 is turn-on driven, and thus, even if the overcurrent flows to the switching element S2 and the first protection function of the integrated circuit 31 is operated to turn-on drive the switching element S1, the motor 22 is not driven. Further, only the switching element S4 is turn-on driven, and thus, even if the overcurrent flows to the switching element S4 and the second protection function of the integrated circuit 35 is operated to turn-on drive the switching element S3, the motor 22 is not driven. As a result, it is possible to prevent the motor 22 from being driven when the braking is required for the motor 22.

In the back door drive device 20 of the present embodiment described above, when the braking condition is satisfied during the forward rotation of the motor 22, only the switching element S2 is turn-on driven, and when the braking condition is satisfied during the reverse rotation of the motor 22, only the switching element S4 is turn-on driven. Therefore, the switching elements of different integrated circuits are turn-on driven when the motor 22 is braked during the forward rotation of the motor 22 and when the motor 22 is braked during the reverse rotation of the motor 22, and thus, it is possible to reduce the accumulation of the thermal loads acting on the integrated circuits 31 and 35. As a result, it is possible to suppress a decrease in the life of the integrated circuits 31 and 35.

In the embodiment, when the braking condition is satisfied during the forward rotation of the motor 22, only the switching element S2 of the integrated circuit 31 is turn-on driven, and when the braking condition is satisfied during the reverse rotation of the motor 22, only the switching element S4 of the integrated circuit 35 is turn-on driven. However, when the braking condition is satisfied during the forward rotation of the motor 22, only the switching element S3 of the integrated circuit 35 may be turn-on driven, and when the braking condition is satisfied during the reverse rotation of the motor 22, only the switching element S1 of the integrated circuit 31 may be turn-on driven. Even in this case, it is possible to suppress the decrease in the life of the integrated circuits 31 and 35.

In the embodiment, the integrated circuits 31 and 35 have the first and second protection functions, respectively, but may not have the first and second protection functions.

Figure 4:
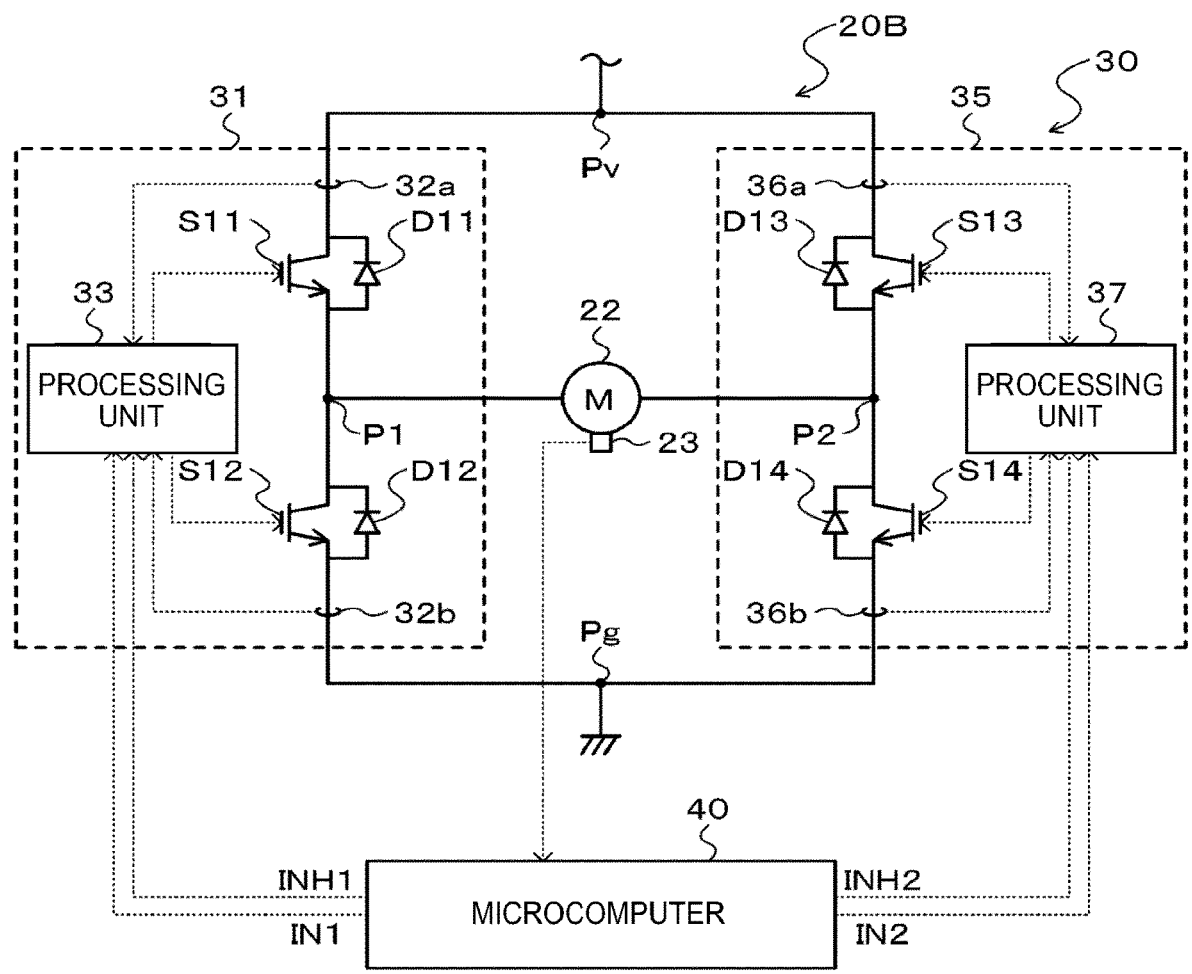
FIG. 4 is a configuration diagram illustrating an outline of a configuration of the back door drive device.

In the embodiment, as illustrated in the back door drive device 20 of FIG. 2, the p-channel field effect transistors in which the parasitic diodes D1 and D3 functioning as the freewheeling diodes are incorporated are used as the switching elements S1 and S3, and the n-channel field effect transistors in which the parasitic diodes D2 and D4 functioning as the freewheeling diodes are incorporated are used as the switching elements S2 and S4. However, as illustrated in a back door drive device 20B of FIG. 4, for example, insulated gate bipolar transistors (IGBTs) S11 to S14 may be used as switching elements S11 to S14, and freewheeling diodes D11 to D14 may be attached in reversely parallel to the switching elements S11 to S14. The back door drive device 20B is the same as the back door drive device 20 except that the switching elements S1 to S4 in which the parasitic diodes D1 to D4 are incorporated are replaced with the switching elements S11 to S14 and the freewheeling diodes D11 to D14.

In the embodiment, the back door drive device 20 which opens or closes the back door BD is described as the opening/closing body drive device, but this disclosure is not limited to this. That is, the opening/closing body drive device may be a drive device which opens or closes a slide door of a vehicle or the like.

In the embodiment, this disclosure is described as the form of the opening/closing body drive device, but may be described in a form of a control method of the opening/closing body drive device.

A correspondence between main elements of the embodiment and the main elements of this disclosure described in Summary will be described. In the embodiment, the motor 22 corresponds to a "motor", the drive unit 30 corresponds to a "drive unit", and the microcomputer 40 corresponds to a "control unit".

A correspondence between the main elements of the embodiment and the main elements of this disclosure described in Summary is an example of an embodiment for specifically explaining a mode for carrying out this disclosure described in Summary, and thus, does not limit the elements of this disclosure described in Summary. That is, an interpretation of this disclosure described in Summary should be made based on the description in Summary, and the embodiments are a merely specific example of this disclosure described in Summary.

Hereinbefore, the embodiments for carrying out this disclosure are described. However, this disclosure is not limited to the embodiments, and various embodiments can be carried out within a scope which does not depart from a gist of this disclosure.

This disclosure can be used in a manufacturing industry of the opening/closing body drive device.

An opening/closing body drive device according to an aspect of this disclosure includes: a motor which opens or closes an opening/closing body; a drive unit which rotates the motor; and a control unit which controls the drive unit, in which the drive unit includes a first integrated circuit having first and second switching elements which are connected to each other in series with respect to a positive electrode side and a negative electrode side of a power source and a connection point of which is connected to one terminal of the motor, and a second integrated circuit having third and fourth switching elements which are connected to each other in series with respect to the positive electrode side and the negative electrode side and a connection point of which is connected to the other terminal of the motor, first to fourth freewheeling diodes are incorporated in or attached in parallel to the first to fourth switching elements, the control unit turn-on drives the first and fourth switching elements when driving the motor to be rotated forward and turn-on drives the second and third switching elements when driving the motor to be rotated reversely, and the control unit turn-on drives only the second switching element of the first to fourth switching elements when braking the motor during the forward rotation of the motor and turn-on drives only the fourth switching element of the first to fourth switching elements when braking the motor during the reverse rotation of the motor, or the control unit turn-on drives only the third switching element of the first to fourth switching elements when braking the motor during the forward rotation of the motor and turn-on drives only the first switching element of the first to fourth switching elements when braking the motor during the reverse rotation of the motor.

In the opening/closing body drive device according to the aspect of this disclosure, only the second switching element of the first to fourth switching elements is turn-on driven when braking the motor during the forward rotation of the motor and only the fourth switching element of the first to fourth switching elements is turn-on driven when braking the motor during the reverse rotation of the motor, or only the third switching element of the first to fourth switching elements is turn-on driven when braking the motor during the forward rotation of the motor and only the first switching element of the first to fourth switching elements is turn-on driven when braking the motor during the reverse rotation of the motor. Therefore, the switching elements of different integrated circuits are turn-on driven when the motor is braked during the forward rotation of the motor and when the motor is braked during the reverse rotation of the motor, and thus, it is possible to reduce accumulation of a thermal load acting on the first and second integrated circuits. As a result, it is possible to suppress a decrease in life of the first and second integrated circuits. When only the second switching element is turn-on driven during the forward rotation of the motor, a closed circuit of the second switching element, the fourth freewheeling diode, the motor, and the second switching element is formed, and thus, it is possible to brake the motor. When only the fourth switching element is turn-on driven during the reverse rotation of the motor, a closed circuit of the fourth switching element, the second freewheeling diode, the motor, and the fourth switching element is formed, and thus, it is possible to brake the motor. When only the third switching element is turn-on driven during the forward rotation of the motor, a closed circuit of the third switching element, the motor, the first freewheeling diode, and the third switching element is formed, and thus, it is possible to brake the motor. When only the first switching element is turn-on driven during the reverse rotation of the motor, a closed circuit of the first switching element, the motor, the third freewheeling diode, and the first switching element is formed, and thus, it is possible to brake the motor.

In the opening/closing body drive device according to the aspect of this disclosure, the first integrated circuit may have a first protection function of, when an overcurrent of the first switching element is detected during the turn-on driving of the first switching element, switching the turn-on driving of the first switching element to the turn-on driving of the second switching element, and when an overcurrent of the second switching element is detected during the turn-on driving of the second switching element, switching the turn-on driving of the second switching element to the turn-on driving of the first switching element, and the second integrated circuit may have a second protection function of, when an overcurrent of the third switching element is detected during the turn-on driving of the third switching element, switching the turn-on driving of the third switching element to the turn-on driving of the fourth switching element, and when an overcurrent of the fourth switching element is detected during the turn-on driving of the fourth switching element, switching the turn-on driving of the fourth switching element to the turn-on driving of the third switching element. In this case, in a case where the second and fourth switching elements are turn-on driven regardless of the rotation direction of the motor when the motor is braked during the forward rotation or the reverse rotation of the motor, when the first protection function is operated, the motor is driven to be rotated forward by turn-on driving the first and fourth switching elements, or when the second protection function is operated, the motor is driven to be rotated reversely by turn-on driving the second and third switching elements. Meanwhile, by turn-on driving only one of the first to fourth switching elements, it is possible to prevent the motor from being driven when braking is requested for the motor.

A control method of opening/closing body drive device according to another aspect of this disclosure is a control method of opening/closing body drive device including: a motor which opens or closes an opening/closing body, and a drive unit which rotates the motor, in which the drive unit includes a first integrated circuit having first and second switching elements which are connected to each other in series with respect to a positive electrode side and a negative electrode side of a power source and a connection point of which is connected to one terminal of the motor, and a second integrated circuit having third and fourth switching elements which are connected to each other in series with respect to the positive electrode side and the negative electrode side and a connection point of which is connected to the other terminal of the motor, and first to fourth freewheeling diodes are incorporated in or attached in parallel to the first to fourth switching elements. The method includes: turn-on driving the first and fourth switching elements when driving the motor to be rotated forward and turn-on driving the second and third switching elements when driving the motor to be rotated reversely; and turn-on driving only the second switching element of the first to fourth switching elements when braking the motor during the forward rotation of the motor and turn-on driving only the fourth switching element of the first to fourth switching elements when braking the motor during the reverse rotation of the motor, or turn-on driving only the third switching element of the first to fourth switching elements when braking the motor during the forward rotation of the motor and turn-on driving only the first switching element of the first to fourth switching elements when braking the motor during the reverse rotation of the motor.

In the control method for the opening/closing body drive device according to the aspect of this disclosure, only the second switching element of the first to fourth switching elements is turn-on driven when braking the motor during the forward rotation of the motor and only the fourth switching element of the first to fourth switching elements is turn-on driven when braking the motor during the reverse rotation of the motor, or only the third switching element of the first to fourth switching elements is turn-on driven when braking the motor during the forward rotation of the motor and only the first switching element of the first to fourth switching elements is turn-on driven when braking the motor during the reverse rotation of the motor. Therefore, the switching elements of different integrated circuits are turn-on driven when the motor is braked during the forward rotation of the motor and when the motor is braked during the reverse rotation of the motor, and thus, it is possible to reduce accumulation of a thermal load acting on the first and second integrated circuits. As a result, it is possible to suppress a decrease in life of the first and second integrated circuits. When only the second switching element is turn-on driven during the forward rotation of the motor, a closed circuit of the second switching element, the fourth freewheeling diode, the motor, and the second switching element is formed, and thus, it is possible to brake the motor. When only the fourth switching element is turn-on driven during the reverse rotation of the motor, a closed circuit of the fourth switching element, the second freewheeling diode, the motor, and the fourth switching element is formed, and thus, it is possible to brake the motor. When only the third switching element is turn-on driven during the forward rotation of the motor, a closed circuit of the third switching element, the motor, the first freewheeling diode, and the third switching element is formed, and thus, it is possible to brake the motor. When only the first switching element is turn-on driven during the reverse rotation of the motor, a closed circuit of the first switching element, the motor, the third freewheeling diode, and the first switching element is formed, and thus, it is possible to brake the motor.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:
1. An opening/closing body drive device comprising:
a motor which opens or closes an opening/closing body;
a drive unit which rotates the motor; and
a control unit which controls the drive unit, wherein
the drive unit includes a first integrated circuit having first and second switching elements which are connected to each other in series with respect to a positive electrode side and a negative electrode side of a power source and a connection point of which is connected to one terminal of the motor, and a second integrated circuit having third and fourth switching elements which are connected to each other in series with respect to the positive electrode side and the negative electrode side and a connection point of which is connected to the other terminal of the motor, first to fourth freewheeling diodes are incorporated in or attached in parallel to the first to fourth switching elements, the control unit turn-on drives the first and fourth switching elements when driving the motor to be rotated forward and turn-on drives the second and third switching elements when driving the motor to be rotated reversely, the control unit turn-on drives only the second switching element of the first to fourth switching elements when braking the motor during the forward rotation of the motor and turn-on drives only the fourth switching element of the first to fourth switching elements when braking the motor during the reverse rotation of the motor, or the control unit turn-on drives only the third switching element of the first to fourth switching elements when braking the motor during the forward rotation of the motor and turn-on drives only the first switching element of the first to fourth switching elements when braking the motor during the reverse rotation of the motor, the first integrated circuit has a first protection function of, when an overcurrent of the first switching element is detected during the turn-on driving of the first switching element, switching the turn-on driving of the first switching element to the turn-on driving of the second switching element, and when an overcurrent of the second switching element is detected during the turn-on driving of the second switching element, switching the turn-on driving of the second switching element to the turn-on driving of the first switching element, and the second integrated circuit has a second protection function of, when an overcurrent of the third switching element is detected during the turn-on driving of the third switching element, switching the turn-on driving of the third switching element to the turn-on driving of the fourth switching element, and when an overcurrent of the fourth switching element is detected during the turn-on driving of the fourth switching element, switching the turn-on driving of the fourth switching element to the turn-on driving of the third switching element.

2. A control method of an opening/closing body drive device including a motor which opens or closes an opening/closing body, and a drive unit which rotates the motor, in which the drive unit includes a first integrated circuit having first and second switching elements which are connected to each other in series with respect to a positive electrode side and a negative electrode side of a power source and a connection point of which is connected to one terminal of the motor, and a second integrated circuit having third and fourth switching elements which are connected to each other in series with respect to the positive electrode side and the negative electrode side and a connection point of which is connected to the other terminal of the motor, and in which first to fourth freewheeling diodes are incorporated in or attached in parallel to the first to fourth switching elements, the method comprising:

turn-on driving the first and fourth switching elements when driving the motor to be rotated forward and turn-on driving the second and third switching elements when driving the motor to be rotated reversely; and turn-on driving only the second switching element of the first to fourth switching elements when braking the motor during the forward rotation of the motor and turn-on driving only the fourth switching element of the first to fourth switching elements when braking the motor during the reverse rotation of the motor, or turn-on driving only the third switching element of the first to fourth switching elements when braking the motor during the forward rotation of the motor and turn-on driving only the first switching element of the first to fourth switching elements when braking the motor during the reverse rotation of the motor, wherein the first integrated circuit has a first protection function of, when an overcurrent of the first switching element is detected during the turn-on driving of the first switching element, switching the turn-on driving of the first switching element to the turn-on driving of the second switching element, and when an overcurrent of the second switching element is detected during the turn-on driving of the second switching element, switching the turn-on driving of the second switching element to the turn-on driving of the first switching element, and the second integrated circuit has a second protection function of, when an overcurrent of the third switching element is detected during the turn-on driving of the third switching element, switching the turn-on driving of the third switching element to the turn-on driving of the fourth switching element, and when an overcurrent of the fourth switching element is detected during the turn-on driving of the fourth switching element, switching the turn-on driving of the fourth switching element to the turn-on driving of the third switching element.

* * * * *